United States Patent
Kondou

(10) Patent No.: US 8,418,946 B2
(45) Date of Patent: Apr. 16, 2013

(54) CRUSHER FOR CRUSHING A SILICON LUMP, AND SILICON LUMP CRUSHING APPARATUS HAVING A PLURALITY OF CRUSHERS

(75) Inventor: Manabu Kondou, Shunan (JP)

(73) Assignee: Tokuyama Corporation, Shunan-shi (JP)

(*) Notice: Subject to any disclaimer, the term of this patent is extended or adjusted under 35 U.S.C. 154(b) by 189 days.

(21) Appl. No.: 12/992,059

(22) PCT Filed: Aug. 4, 2009

(86) PCT No.: PCT/JP2009/063793
§ 371 (c)(1),
(2), (4) Date: Nov. 10, 2010

(87) PCT Pub. No.: WO2010/016479
PCT Pub. Date: Feb. 11, 2010

(65) Prior Publication Data
US 2011/0068206 A1    Mar. 24, 2011

(30) Foreign Application Priority Data

Aug. 6, 2008 (JP) ................................. 2008-203041
Aug. 27, 2008 (JP) ................................. 2008-218286

(51) Int. Cl.
*B02C 1/00* (2006.01)
(52) U.S. Cl.
USPC ............................................................. 241/283
(58) Field of Classification Search ............... 241/283
See application file for complete search history.

(56) References Cited

U.S. PATENT DOCUMENTS

| | | | | |
|---|---|---|---|---|
| 3,428,231 A | * | 2/1969 | Bundus | 225/1 |
| 3,567,089 A | * | 3/1971 | Klempner et al. | 225/104 |
| 3,802,629 A | * | 4/1974 | Flanagan | 241/14 |
| 3,841,569 A | * | 10/1974 | Engelhardt et al. | 241/4 |
| 4,562,974 A | * | 1/1986 | Bezette et al. | 241/283 |
| 6,598,815 B2 | * | 7/2003 | Hsieh | 241/99 |
| 7,431,230 B2 | * | 10/2008 | McPherson et al. | 241/30 |
| 2010/0025060 A1 | | 2/2010 | Yamane et al. | |

FOREIGN PATENT DOCUMENTS

| | | |
|---|---|---|
| JP | 60-94388 U | 6/1985 |
| JP | 2-152554 A | 6/1990 |
| JP | 5-23977 A | 2/1993 |
| JP | 5-104457 A | 4/1993 |
| JP | 2007-253254 A | 10/2007 |
| WO | WO 2008/047850 A1 | 4/2008 |

OTHER PUBLICATIONS

International Search Report PCT/JP2009/063793 issued Sep. 4, 2009.

* cited by examiner

*Primary Examiner* — Faye Francis
(74) *Attorney, Agent, or Firm* — Birch, Stewart, Kolasch & Birch, LLP

(57) ABSTRACT

A crusher which can transmit energy to be applied to a piston to a silicon lump efficiently, and a silicon lump crushing apparatus which can crush a silicon lump into small pieces by suppressing the production of powders as much as possible and enables the automation of the crushing work of a silicon lump. The crusher is constituted such that a hammer head is connected to a piston. When compressed air is not applied to the piston, the hammer head is elastically urged to a standby position and when compressed air is applied to the piston, the hammer head is moved from the standby position to collide with the silicon lump. In the silicon lump crushing apparatus, a plurality of crushers having a hammer head to be collided with a silicon lump are opposed to the silicon lump supported on a support base and spaced apart from one another.

5 Claims, 6 Drawing Sheets

CRUSHER FOR CRUSHING A SILICON LUMP, AND SILICON LUMP CRUSHING APPARATUS HAVING A PLURALITY OF CRUSHERS

TECHNICAL FIELD

The present invention relates to a crusher which can be advantageously used to crush a silicon lump, especially a rod-like polycrystalline silicon lump to obtain fist-sized pieces called "nuggets" and to a silicon lump crushing apparatus having a plurality of the crushers.

BACKGROUND ART

As already known, a silicon wafer used to manufacture a semiconductor device is produced as follows. A rod-like polycrystalline silicon lump is first produced by the Siemens method and then crushed into fist-sized small pieces. Then, a columnar silicon ingot is produced from the obtained small silicon pieces as raw materials by the Czochralski method, sliced and ground to obtain the silicon wafer.

Patent Document 1 listed below discloses a silicon lump crushing tool which can be used to crush a silicon lump into small silicon pieces. This silicon lump crushing tool comprises pneumatic drive means for driving a piston which is installed in a casing in such a manner that it can move between a retreat position and a projection position and is driven from the retreat position to the projection position by the action of compressed air, a guide tube connected to the casing and extending in the moving direction of the piston, and a hammer head whose rear end is movably inserted into the guide tube. To crush a silicon lump, the piston is driven from the retreat position to the projection position by the action of compressed air while the end of the hammer head is in contact with the silicon lump. Then, the end of the piston collides with the rear end of the hammer head, whereby an impact is applied to the hammer head and transmitted to the silicon lump to crush it.

Patent Document 2 listed below discloses a silicon lump crushing apparatus for crushing a silicon lump by pinching a polycrystalline silicon rod between a pair of pressing/crushing members and pressing it.

PRIOR ART DOCUMENTS

Patent Documents:
Patent Document 1: WO2008/047850A1
Patent Document 2: JP-A 2-152554

OUTLINE OF THE INVENTION

Problems that the Invention is to Solve

The silicon lump crushing tool disclosed by the above Patent Document 1 is relatively inexpensive, and is capable of crushing a silicon lump into small silicon pieces without producing a large amount of waste powders and without requiring an excessive work load, considerable skill and physical force. However, it is still unsatisfactory and has the following problems to be solved. This tool employs a method in which a piston is driven from the retreat position to the projection position to apply an impact to a hammer head while the hammer head is in contact with the silicon lump (which is not a method where the hammer head is moved toward the silicon lump from a position away from the silicon lump to collide with the silicon lump). Therefore, a great amount of energy applied to the piston by the action of compressed air is consumed by the collision of the piston with the stationary hammer head and so, energy cannot be transmitted to the silicon lump highly efficiently. To crush the silicon lump, the end of the hammer head must be brought into contact with the silicon lump manually by an operator, thereby making it impossible to automate the crushing of the silicon lump.

The silicon lump crushing apparatus disclosed by the above Patent Document 2 is very expensive as its constitution is very complex and it requires high horsepower. According to the experience of the inventors of the present invention, a large amount of powders which cannot be used effectively is produced at the time of crushing and therefore, there is also a problem that the yield of small pieces is low.

The present invention has been made in view of the above fact, and it is a first technical object of the present invention to provide a novel and improved crusher which transmits energy to be applied to a piston by compressed air to a silicon lump highly efficiently and allows the automation of the crushing of a silicon lump by eliminating the manual operation of an operator as required.

It is a second technical object of the present invention to provide a novel and improved silicon lump crushing apparatus which it can be manufactured at a relatively low cost, but is still capable of crushing a silicon lump into small pieces by suppressing the production of powders as much as possible and allows the automation of the crushing work of a silicon lump.

Means for Solving the Problems

The inventors of the present invention conducted intensive studies and experiments and found that the above first technical object can be attained by connecting a hammer head to a piston, elastically urging the hammer head to a standby position when compressed air is not applied to the piston and moving it from the standby position to collide with a silicon lump when compressed air is applied to the piston.

That is, according to the present invention, as a crusher attaining the above first technical object, there is provided a crusher for crushing a silicon lump, comprising:

a cylinder case for defining the space of a cylinder bore;

a piston which is stored in the cylinder bore in such a manner that it slidably move between a first position which is one end of the cylinder bore and a second position which is the other end of the cylinder bore;

a blocking member which is fixed in the cylinder case to define the other end of the cylinder bore;

a release path for making the other end of the cylinder bore open to the air;

elastic urging means for elastically urging the piston to the first position;

a rod member which extends from the piston toward the other end of the cylinder bore and projects from the cylinder bore through the blocking member;

a hammer head which is fixed onto a projecting end portion of the rod member;

a compressed air source;

communication means interposed between the one end of the cylinder bore and the compressed air source; and control valve means which is provided on the communication means and selectively switches the cylinder bore between an operation mode in which the cylinder bore is communicated with the compressed air source and a non-operation mode in which the one end of the cylinder bore is made open to the air, wherein when the control valve means is switched to the non-operation mode, the piston is elastically urged to the first position by the elastic urging action of the elastic urging means and when the control valve means is switched to the operation mode, the piston is driven to the second position by compressed air supplied to the one end of the cylinder bore from the compressed air source in defiance of the elastic urging action of the elastic urging means.

Preferably, the cylinder case is made of a metal and its outer wall is covered with a cover member made of synthetic resin. The cover member extends beyond the front end of the cylinder case, and the hammer head is situated posterior to the front end of the cover member when the piston is elastically urged to the first position and projects beyond the front end of the cover member when the piston is driven to the second position. Preferably, the hammer head has a cylindrical outer surface, and the inner diameter of a portion, where the hammer head moves of the cover member corresponds to the outer diameter, of the hammer head so that the movement of the hammer head is guided by the cover member. It is advantageous that the hammer head should be made of a super hard alloy.

The inventors of the present invention conducted intensive studies and experiments and also found that the above second technical object can be attained by opposing a plurality of crushers having a hammer head which is to be collided with a silicon lump to the silicon lump supported on a support base and spacing them apart from one another.

That is, according to the present invention, as a silicon lump crushing apparatus attaining the above second technical object, there is provided a silicon lump crushing apparatus comprising:

a support base for supporting a approximately rod-like polycrystalline silicon lump to be crushed; and a plurality of crushers which are opposed to the rod-like polycrystalline silicon lump supported on the support base and spaced apart from one another, wherein each of the crushers has a hammer head to be collided with the silicon lump supported on the support base.

According to an embodiment of the present invention, the apparatus includes a carrier table having a receiving groove which has a V-shaped cross section, extends in the longitudinal direction and is formed in the top surface of the carrier table, the silicon lump is placed on the receiving groove of the carrier table, and the carrier table is carried onto the support base. Preferably, a movable support member is arranged on the support base, two carrier tables having on the top surface a receiving groove which has a V-shaped cross section and extends in the longitudinal direction are arranged parallel to each other and mounted on the movable support member, the movable support member is moved to a first work position where one carrier table is situated below the crushers and the other carrier table is displaced to one side from the crushers and to a second work position where the other carrier table is situated below the crushers and the one carrier table is displaced to the other side from the crushers, when the movable support member is moved to the first work position, the silicon lump placed on the receiving groove of the one carrier table is crushed by the crushers and a silicon lump to be crushed is carried onto the other carrier table, and when the movable support member is moved to the second work position, the silicon lump placed on the receiving groove of the other carrier table is crushed by the crushers and a silicon lump to be crushed is carried onto the one carrier table. Preferably, the movable support member is further moved to a first exhaust position displaced to the one side beyond the first work position and to a second exhaust position which is displaced to the other side beyond the second work position, the carrier tables are mounted in such a manner that they can turn around an axis extending in the longitudinal direction, when the movable support member is moved to the first exhaust position, the other carrier table is turned around the axis extending in the longitudinal direction at an angle of 90° or more and the crushed silicon lump on the receiving groove is discharged downward, and when the movable support member is moved to the second exhaust position, the one carrier table is turned around the axis extending in the longitudinal direction at an angle of 90° or more and the crushed silicon lump on the receiving groove is discharged downward. Preferably, the crushers are mounted to a support frame which can move vertically and is moved to a work position and a non-work position above the work position, the carrier tables are provided with a cover wall extending upward to cover the receiving grooves, the support frame is provided with a cover wall extending downward to cover the crushers, when the movable support member is moved to the first work position and the support frame is moved down to the work position, the cover wall of the one carrier table and the cover wall of the support frame define a closed space cooperatively, and when the movable support member is moved to the second work position and the support frame is moved down to the work position, the cover wall of the other carrier table and the cover wall of the support frame define a closed space cooperatively. Preferably, the angle between the both side faces of the receiving groove is 110 to 130°. Preferably, the apparatus includes a first crusher positioned right above the silicon lump supported on the support base and second and third crushers positioned on both sides of the first crusher and away from the first crusher at an equal angle when seen from the peripheral direction of the silicon lump. Preferably, the second and third crushers are away from the first crusher at an equal angle of 30 to 80°. Preferably, the hammer heads of the first, second and third crushers are projected toward the center axis of the silicon lump and collided with the silicon lump. Preferably, a plurality of sets of first, second and third crushers are arranged in the longitudinal direction of the silicon lump supported on the support base at intervals.

Effects of the Invention

In the crusher of the present invention, when the piston is driven from the first position to the second position by the action of compressed air, the hammer head connected to the piston through the rod member is moved at a high speed in accordance with the high-speed movement of the piston to be collided with the silicon lump. Therefore, energy applied to the piston is applied to the silicon lump highly efficiently without being wasted. When silicon lumps to be crushed are automatically supplied to the crushing position one after another and the cylinder case of the silicon lump crusher is mounted at a predetermined position for a silicon lump supplied to the crushing position, the silicon lump crusher does not need to be manually positioned with respect to the silicon lump and the silicon lump can be crushed simply by operating the control valve means, thereby making it possible to automate the crushing of the silicon lump.

The silicon lump crushing apparatus of the present invention can be manufactured at a relatively low cost, and it can still automate the crushing work of a silicon lump and can crush a silicon lump into small pieces by suppressing the production of powders as much as possible.

MODE FOR CARRYING OUT THE INVENTION

A crusher and a silicon lump crushing apparatus comprising a plurality of the crushers according to preferred embodiments of the present invention will be described in more detail hereinunder with reference to the accompanying drawings.

Figure 1:
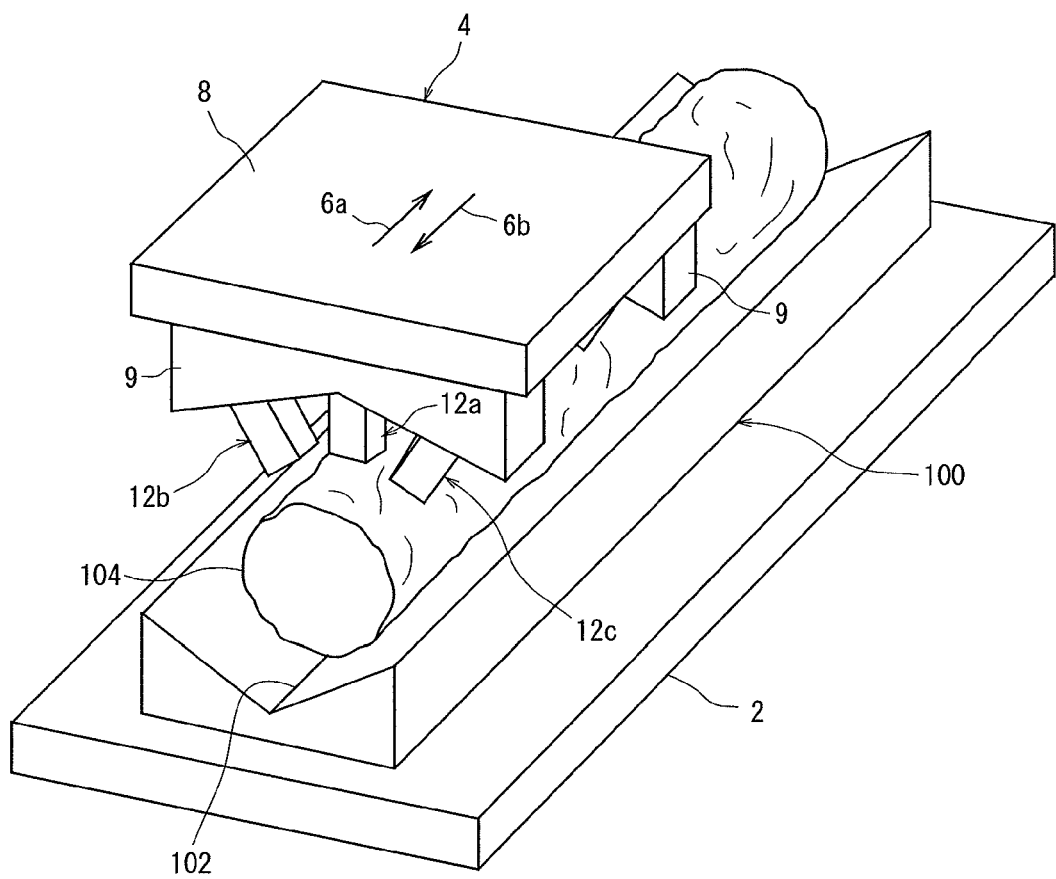
FIG. 1 is a schematic perspective view of the main part of a silicon lump crushing apparatus according to a first preferred embodiment of the present invention.

FIG. 1 schematically illustrates the main part of a silicon lump crushing apparatus according to a first embodiment of the present invention. The illustrated silicon lump crushing apparatus includes a static support base 2 which is supported at a predetermined position by suitable support legs (not shown) and extends substantially horizontally. This support base 2 may be made of a material having high stiffness such as stainless steel. A support frame 4 is arranged above and opposed to the support base 2. This support frame 4 is suspended by suitable suspending means (not shown) in such a manner that it can move in the longitudinal direction of the support base 2, that is, directions shown by arrows 6a and 6b in FIG. 1 and driven in the directions shown by the arrows 6a and 6b by drive means (not shown) including an electric motor.

Figure 2:
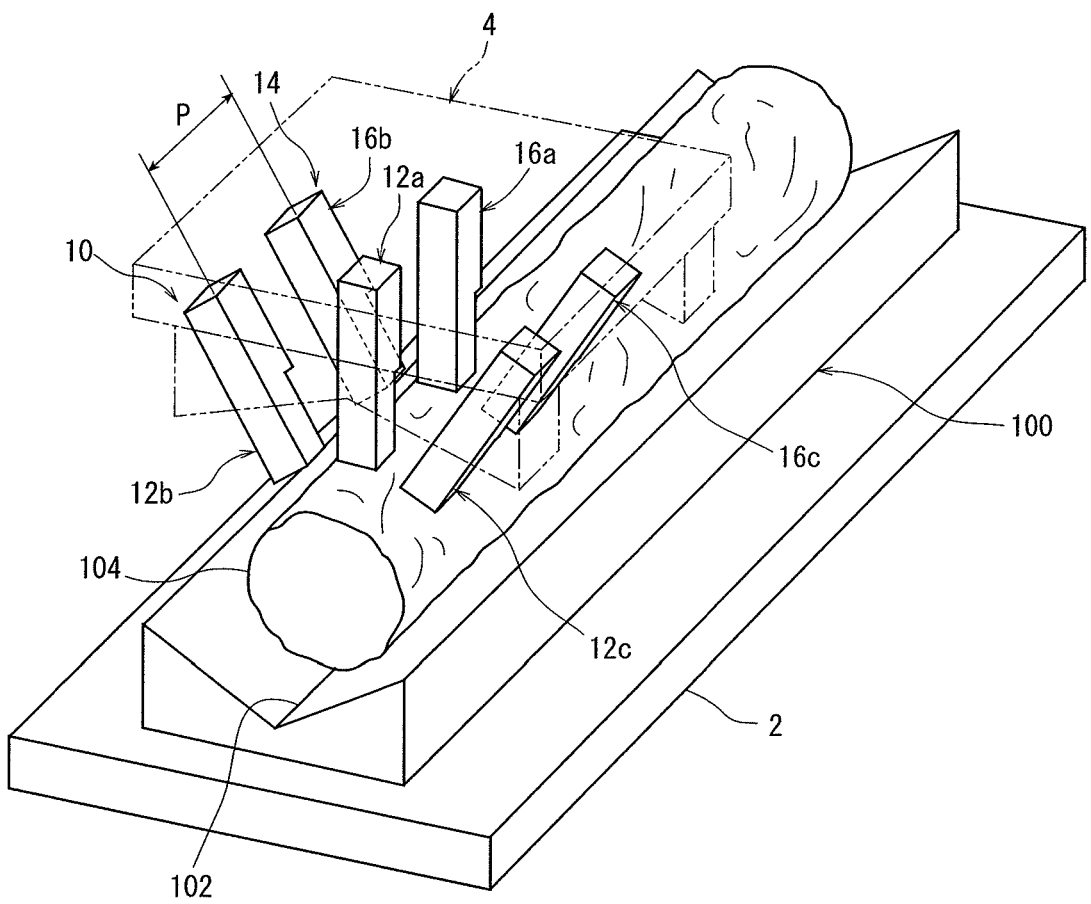
FIG. 2 is a schematic perspective view showing the arrangement of the crushers of the silicon lump crushing apparatus shown in FIG. 1.
Figure 3:
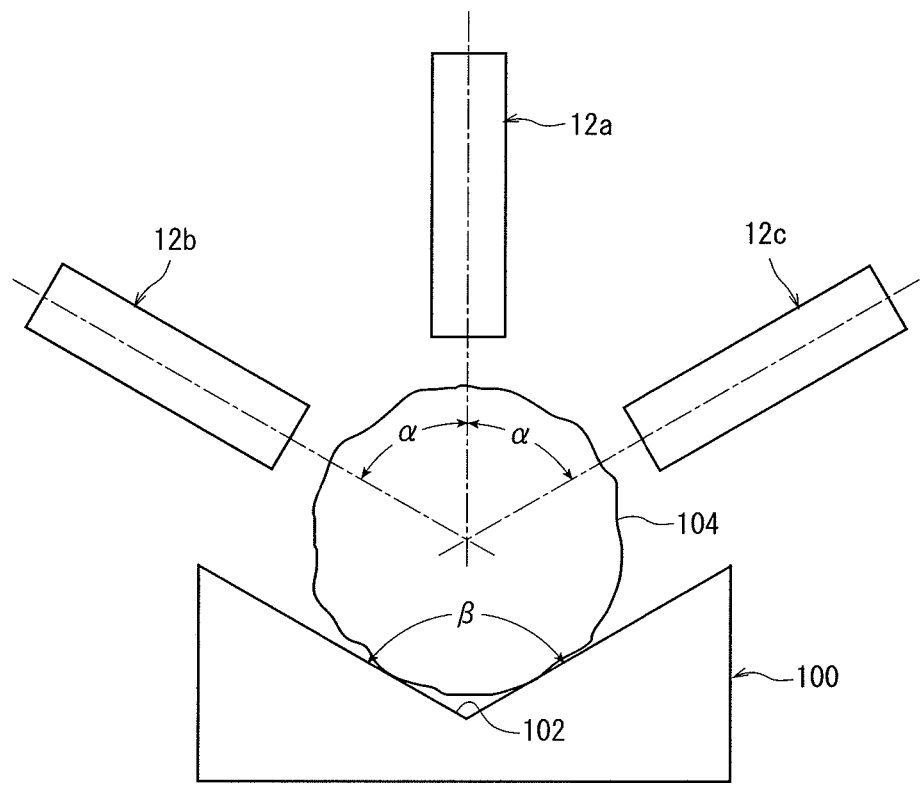
FIG. 3 is a front view of the main part of the silicon lump crushing apparatus shown in FIG. 1.

Describing with reference to FIG. 2 and FIG. 3 together with FIG. 1, the support frame 4 has a top panel 8 which extends substantially horizontally, and two support members 9 are fixed to the under surface of the top panel 8 with a space therebetween in the longitudinal direction. This support members 9 are each provided with a plurality of crushers. In the illustrated embodiment, three crushers 12a, 12b and 12c (first crusher 12a, second crusher 12b and third crusher 12c) constituting a first set 10 of crushers are mounted to one of the support members 9, and three crushers 16a, 16b and 16c (first crusher 16a, second crusher 16b and third crusher 16c) constituting a second set 14 of crushers are mounted to the other support member 9. The three crushers 12a, 12b and 12c constituting the first set 10 of crushers are substantially the same in position in the longitudinal direction of the support base 2 (stated more specifically, the center axes in the longitudinal direction of the hammer heads which will be described hereinafter of the three crushers 12a, 12b and 12c are located on the common plane which is perpendicular to the center axis in the longitudinal direction of the support base 2), the crusher 12a extends substantially perpendicularly to the support base 2 (therefore vertically), and the crushers 12b and 12c are arranged on both sides of the crusher 12a at an angle of α from the crusher 12a and inclined inward and downward at an angle of α from the plumb line. The angle α is preferably 30 to 80°, more preferably 55 to 65°, particularly preferably 60°. Preferably, the center axes in the longitudinal direction of the hammer heads which will be described hereinafter of the three crushers 12a, 12b and 12c extend toward the center axis of a silicon lump to be crushed. The second set 14 of crushers are spaced apart from the first set 10 of crushers at a pitch P in the longitudinal direction of the support base 2. Like the first set 10 of crushers, the crusher 16a extends substantially perpendicularly to the support base 2 (therefore, vertically), and the crushers 16b and 16c are arranged on both sides of the crusher 16a at an angle of α from the crusher 16a and inclined inward and downward at an angle of α from the plumb line. In the illustrated embodiment, the first set 10 of crushers and the second set 14 of crushers are provided. If desired, three or more sets of crushers can be provided at suitable intervals in the longitudinal direction of the support base 2.

The crushers 12a, 12b and 12c and the crushers 16a, 16b and 16c are substantially the same in constitution. Describing the details of the constitution of the crusher 12a with reference to FIG. 4, the crusher 12a comprises a cylinder case 24 which may be made of a suitable metal such as stainless steel. The cylinder case 24 has a front end portion 26 whose cross section is square and a main portion 28 which has a portion projecting upward and a vertically long rectangular cross section. A cavity open to the front face (right-side face in FIG. 4) is formed in the cylinder case 24. The cavity having a circular cross section has a main portion 32 which is cylindrical and extends in the axial direction, a rear end portion 34 which is slightly smaller than the main portion 32 in diameter, an intermediate step portion 36 which is slightly larger than the main portion 32 in diameter and a front end portion 38 which is much larger than the intermediate step portion 36 in diameter. One end, that is, the rear end (left end in FIG. 4) of the cavity is closed by the rear end wall 40 of the cylinder case 24. A conically dent portion 42 is formed in the inner surface of the rear end wall 40. A blocking member 44 is fitted in the other end, that is, front end portion (right end portion in FIG. 1) of the cavity to close the cavity therewith. Thus, a cylinder bore 46 whose one end is defined by the rear end wall 40 and whose other end is defined by the blocking member 44 is formed in the cylinder case 24. A through hole 48 extending in the center axial direction is formed in the blocking member 44. The through hole 48 has a circular cross section. The blocking member 44 has a large-diameter front portion 49 which has an outer diameter corresponding to the inner diameter of the front end portion 38 of the cavity formed in the cylinder case 24, a main portion 50 which has an outer diameter corresponding to the inner diameter of the intermediate step portion 36 of the cavity and a rear portion 52 which has a slightly smaller outer diameter than the inner diameter of the main portion 32 of the cavity. A male thread is formed on the outer wall of the front portion 49 of the blocking member 44 and mated with a female thread formed on the inner wall defining the front end portion 38 of the cavity to fix the blocking member 44 in the front portion of the cylinder case 24. An annular groove is formed in the outer wall of the main portion 50 of the blocking member 44, and a seal ring 54 which may be made of synthetic rubber is stored in the annular groove. An annular groove is also formed in the inner wall of the through hole 48 of the blocking member 44, and a seal ring 56 which may be made of synthetic rubber is stored in the annular groove.

A piston 58 is stored in the cylinder bore 46 in such a manner that it can move between a first position shown by a solid line and a second position shown by a two-dotted chain line. A through hole 60 extending in the center axial direction is formed in the piston 58 which may be made of a suitable metal such as hard alumite or stainless steel. The through hole 60 has a circular cross section and is cylindrical as a whole. When the piston 58 is moved to the first position, the rear surface (left-side surface in FIG. 4) of the piston 58 is brought into contact with an annular shoulder face formed at the interface between the main portion 32 and the rear end portion 34 of the cavity. When the piston 58 is moved to the second position, an annular projection 62 formed on the front face (right-side face in FIG. 4) of the piston 58 is brought into contact with the rear face of the blocking member 44. The outer diameter of the piston 58 corresponds to the inner diameter of the cylinder bore 46 (that is, the inner diameter of the main portion 32 of the cavity). An annular groove is formed in the outer wall of the piston 58, and a seal ring 64 which may be made of synthetic rubber is stored in this annular groove.

A rod member 66 is fixed in the piston 58. The rod member 66 which may be made of a suitable metal such as stainless steel is shaped like a rod and has a main portion 68 and a rear portion 70 which has a relatively small diameter. The outer diameter of the rear portion 70 corresponds to the inner diameter of the through hole 60 formed in the piston 58. The rear portion 70 of the rod member 66 is inserted into the through hole 60, and a fastening nut 72 is screwed onto a projection portion projecting backward from the through hole 60 to fix the rod member 66 in the piston 58. The main portion 68 of the rod member 66 extends forward (right direction in FIG. 1) from the piston 58 and is inserted into the through hole 48 formed in the blocking member 44. The outer diameter of the main portion 68 corresponds to the inner diameter of the through hole 48 and a space between them is sealed up with the seal ring 56.

A hammer head 74 is fixed onto the projection end portion projecting beyond the blocking member 44 of the rod member 66. The hammer head 74 is cylindrical, and a female screw hole is formed in the rear end portion. A male screw is formed on the projecting end portion of the rod member 66 and screwed into the female screw hole of the hammer head 74 so as to fix the hammer head 74 onto the projecting end portion of the rod member 66. It is advantageous that the hammer head 74 should be made of a super hard alloy having a Rockwell A hardness (HRA) of 80 or more, for example, a super hard alloy comprising tungsten carbide and cobalt as the main ingredients.

Elastic urging means 76 which elastically urges the piston 58 to the first position shown by the solid line is interposed between the piston 58 and the blocking member 44. In the illustrated embodiment, the elastic urging means 76 is composed of a compression coil spring whose front end portion is mated with the rear portion of the blocking member 44 and whose rear end portion is mated with the annular projection 62 formed on the front face of the piston 58.

Two communication holes 78 and 80 extending from the cylinder bore 46 to the top surface are formed in the upper wall of the main portion 28 of the cylinder case 24. The communication hole 78 is located at a position corresponding to the rear end portion of the cylinder bore 46, that is, posterior to the piston 58 situated at the first position. The communication hole 78 is connected to a compressed air source 82 by suitable communication means (not shown) such as a flexible hose (this compressed air source 82 can be provided for each of the six crushers 12a, 12b, 12c, 16a, 16b and 16c but it is advantageous that one shared compressed air source 82 should be provided). The communication means is provided with control valve means 84 which selectively switches the communication hole 78 to an operation mode in which it is connected to the compressed air source 82 and to a non-operation mode in which it is made open to the air. The communication hole 80 is located at a position corresponding to the front end portion of the cylinder bore 46, that is, posterior to the blocking member 44 and defines a release path which directly makes the cylinder bore 46 open to the air.

Figure 4:
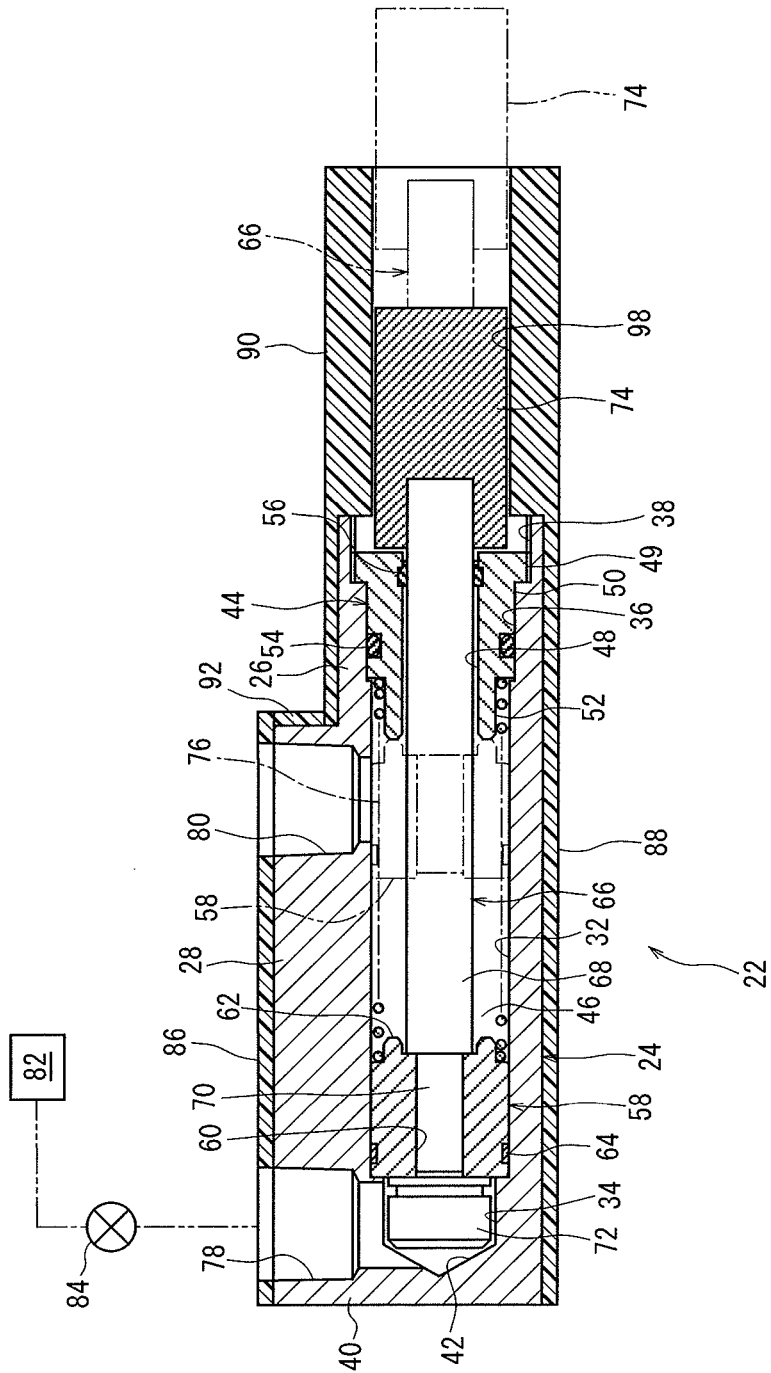
FIG. 4 is a sectional view of a crusher in the silicon lump crushing apparatus shown in FIG. 1.

To prevent the contamination of silicon to be crushed by a metal forming the cylinder case 24, it is preferred that the outer wall of the cylinder case 24 should be covered with synthetic resin cover members such as nylon covers. FIG. 4 shows a cover member 86 which covers the top surface of the main portion 28 of the cylinder case 24, a cover member 88 which covers the under surfaces of the main portion 28 and the front end portion 26 of the cylinder case 24, a cover member 90 which covers the top surface of the front end portion 26 of the cylinder case 24, and a cover member 92 which covers the shoulder face at the interface between the main portion 28 and the front end portion 26 of the cylinder case 24. A cover member (not shown) is also provided to cover both side surfaces of the main portion 28 and the front end portion 26 of the cylinder case 24. These cover members can be bonded to the outer wall of the cylinder case 24 by a suitable adhesive. Preferably, the cover member 90 which covers the top surface of the front end portion 26 of the cylinder case 24, the cover member 88 which covers the under surfaces of the main portion 28 and the front end portion 26 of the cylinder case 24 and the cover member (not shown) which covers the both side surfaces of the cylinder case 24 extend beyond the front end (right end in FIG. 4) of the cylinder case 24. Preferably, when the piston 58 is moved to the second position, the hammer head 74 is projected beyond the cover members 90 and 88 and the two cover members (not shown) as shown by the two-dotted chain line and when the piston 58 is moved to the first position, the front end of the hammer head 74 is retreated from the front ends of the cover members 90 and 88 and the two cover members (not shown). Preferably, portions projecting forward beyond the front end of the cylinder case 24 of the cover members 90 and 88 and the two cover members (not shown) are expanded inward in the radial direction to be made thick so that a guide hole 98 having a circular cross section and an inner diameter corresponding to the outer diameter of the hammer head 74 is defined.

In the above-described crusher 12a, the control valve means 84 which has been set to a non-operation mode is switched to an operation mode by suitable manual or automatic control means (not shown) for a predetermined time (for example, 2 seconds). Thereby, the compressed air source 82 is communicated with the rear end portion of the cylinder bore 46 through the connection means (not shown) for the predetermined time so that compressed air is flown into the rear end portion of the cylinder bore 46. Therefore, the piston 58 is moved to the second position by the action of compressed air in defiance of elastic urging by the elastic urging means 76, and the hammer head 74 is projected beyond the front ends of the cover members 90 and 88 and further collided with a silicon lump to be crushed as will be described hereinafter, whereby the silicon lump is crushed. The compressed air supplied into the cylinder bore 46 preferably has a pressure of 0.5 to 1.0 MPa, and the hammer head 74 is collided with the silicon lump at a speed of preferably 5 to 35 m/sec, particularly preferably 10 to 20 m/sec. When the piston 58 is moved from the first position to the second position, air existent anterior to the piston 58 in the cylinder bore 46 is discharged to the air through the communication hole 80 forming the release path. When the control valve means 84 is returned to the non-operation mode after the elapse of a predetermined time, for example, 2 seconds, the rear end of the cylinder bore 46 is communicated with the air through the communication hole 78 and the communication means (not shown). Then, the piston 58 is returned to the first position by the elastic urging action of the elastic urging means 76 and the hammer head 74 is retreated into the cover members 90 and 88.

Continuing description with reference to FIGS. 1 to 3, in the illustrated silicon lump crushing apparatus, a carrier table 100 formed separately is used. This carrier table 100 has sufficiently high strength but it is important that it should be made of a material which does not contaminate a silicon lump mounted thereon, for example, nylon. A receiving groove 102 which has a V-shaped cross section and extends in the longitudinal direction along the entire length of the carrier table 100 is formed in the top surface of the elongated carrier table 100. Both side faces of the receiving groove 102 form an angle β of preferably 110 to 130°, particularly preferably 120°. The rear surface of the carrier table 100 may be flat.

A description is subsequently given of the function of the above-described silicon lump crushing apparatus. As well known to people having ordinary skill in the art, a polycrystalline silicon lump 104 produced by the Siemens method is approximately shaped like a circular rod. This silicon lump 104 is placed on the receiving groove 102 so that it extends along the receiving groove 102 of the carrier table 100. The silicon lump 104 is moved to a predetermined position (more specifically, a position where the center axis in the longitudinal direction of the silicon lump 104 is aligned with the center axes of the hammer heads 74 of the crushers 12a and 16a) on the support base 2 by carrying the carrier table 100 onto the support base 2 with suitable conveyor means (not shown).

Then, the control valve means 84 of the six crushers 12a, 12b, 12c, 16a, 16b and 16c are switched to an operation mode. Then, the hammer heads 74 of the crushers 12a, 12b and 12c and the crushers 16a, 16b and 16c are projected and collided with the silicon lump 104 placed on the carrier table 100 to crush the silicon lump 104. When the size in the longitudinal direction of the silicon lump 104 is larger than the distance between the crushers 12a, 12b and 12c and the crushers 16a, 16b and 16c, the support frame 4 to which the crushers 12a, 12b and 12c and the crushers 16a, 16b and 16c are fixed is suitably moved in a direction shown by the arrow 6a or 6b so as to move the crushers 12a, 12b and 12c and the crushers 16a, 16b and 16c to a position above a portion which is not crushed of the silicon lump 104, and then the crushers 12a, 12b and 12c and the crushers 16a, 16b and 16c are put into operation again. As required, the movement of the support frame 4 and the operation of the crushers 12a, 12b and 12c and the crushers 16a, 16b and 16c can be repeated more than one time.

Only two crushers 12a and 16a may be selectively put into operation, or four crushers 12b, 12c, 16b and 16c may be selectively put into operation in place of operating all of the crushers 12a, 12b and 12c and the crushers 16a, 16b and 16c. As will be understood from the Experimental Examples which will be described hereinafter, the size of each silicon piece obtained by crushing can be changed according to which ones of the six crushers 12a, 12b, 12c, 16a, 16b and 16c are selected to be operated. As the number of crushers in operation increases, the average size of the obtained silicon pieces tends to become smaller and when the number of the crushers in operation decreases, the average size of the obtained silicon pieces tends to become larger.

Silicon pieces scattered beyond the support base 2 by crushing can be collected into a collection case (not shown) installed below the support base 2. Silicon pieces scattered beyond the carrier table 100 and dropped on the support base 2 can be dropped into the collection case by suitable collection means such as a rubbing blade. Silicon pieces remaining on the carrier table 100 are taken out from the support base 2 together with the carrier table 100 and can be collected into a suitable collection case (not shown).

Figure 5:
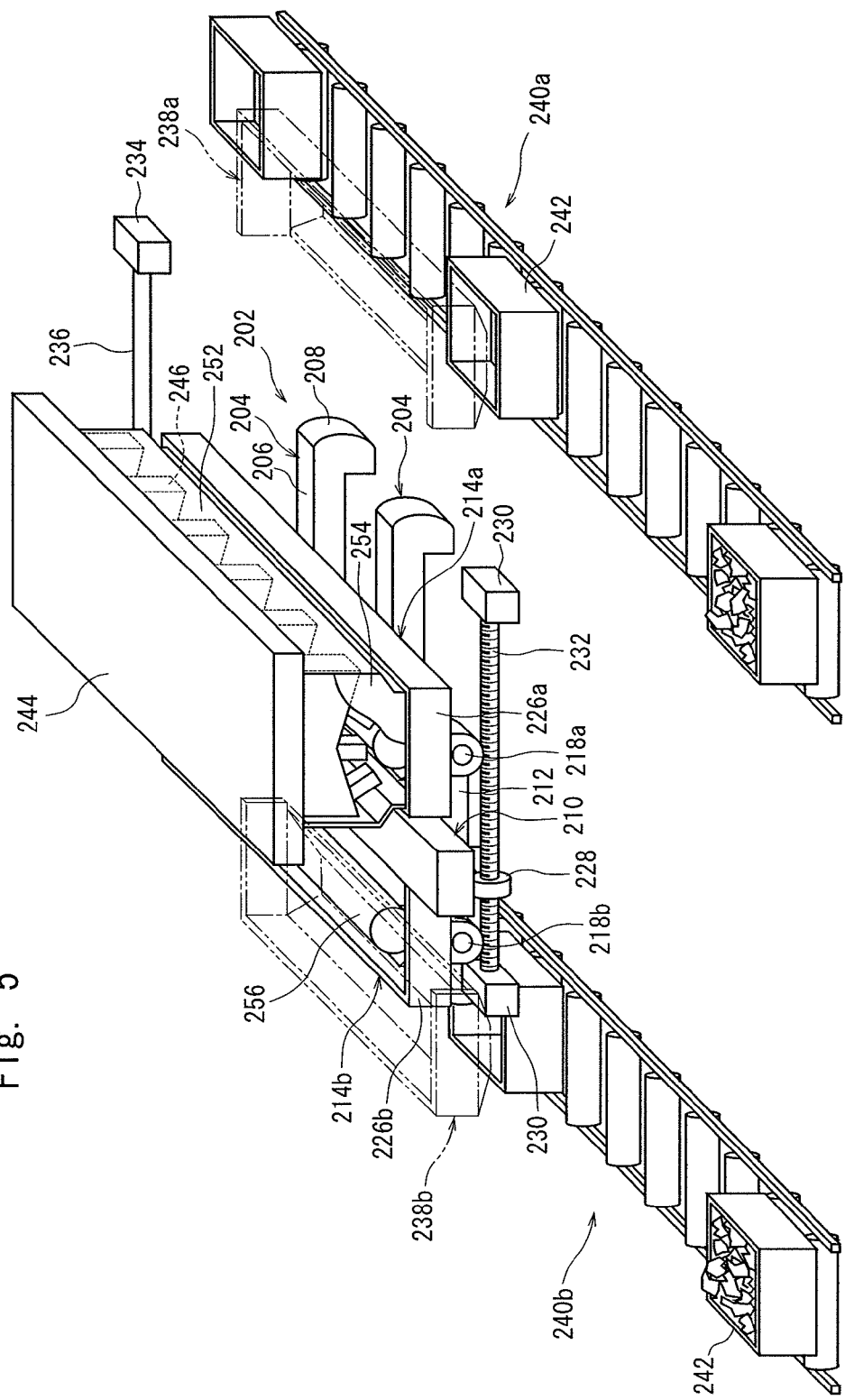
FIG. 5 is a schematic perspective view of the main part of a silicon lump crushing apparatus according to a second preferred embodiment of the present invention.
Figure 6:
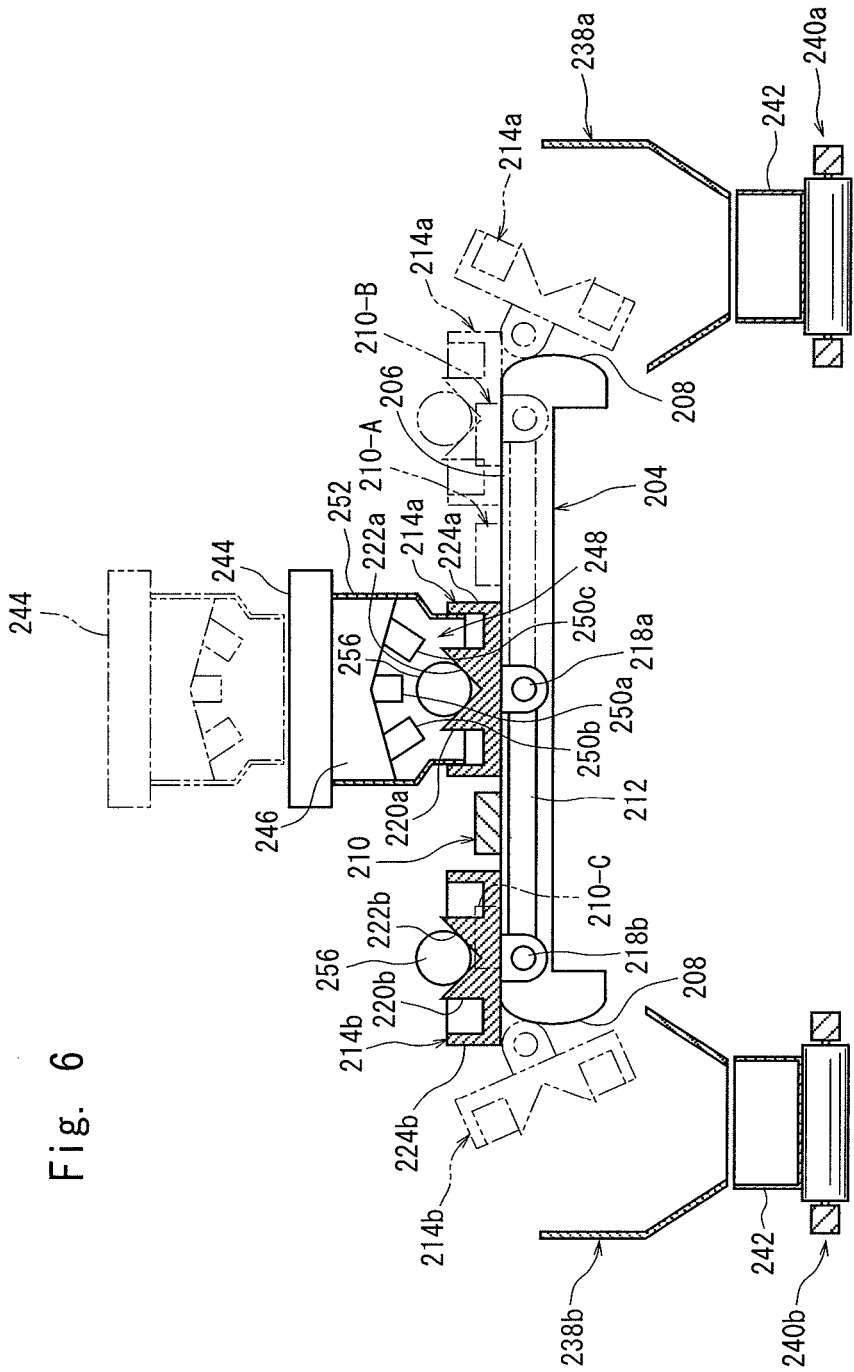
FIG. 6 is a sectional view of the main part of the silicon lump crushing apparatus shown in FIG. 5.

FIG. 5 and FIG. 6 show the main part of a silicon lump crushing apparatus according to a second embodiment of the present invention. In this second embodiment, a static support base 202 is composed of a pair of support beams 204 which are spaced apart from each other in the longitudinal direction (direction perpendicular to the sheet in FIG. 6) and extend in the crosswise direction. Each of the support beams 204 supported at a predetermined position by suitable support legs (not shown) has a top surface 206 extending substantially horizontally and both side surfaces 208 extending approximately in an arc form. A movable support member 210 which extends in the longitudinal direction is mounted on the pair of support beams 204 in such a manner that it slidably move in the crosswise direction. Auxiliary support members 212 (only one auxiliary support member 212 is shown in FIG. 5 and FIG. 6) which extend toward both sides in the crosswise direction beyond the both sides of the movable support member 210 are fixed to the under surface at the both end portions of the movable support member 210. Two carrier tables 214a and 214b are mounted on the auxiliary support members 212. Stated more specifically, a connection portion (not shown) projecting downward is formed at both end portions of the under surface of each of the carrier tables 214a and 214b, and a through hole is formed in the connection portions. Meanwhile, rotary pins 218a and 218b are fixed to the auxiliary support members 212 so that the carrier tables 214a and 214b are rotatably mounted on the auxiliary support members 212 by inserting the rotary pins 218a and 218b into the above through holes, respectively. At positions shown by solid lines in FIG. 5 and FIG. 6, the under surfaces of the carrier tables 214a and 214b are in contact with the top surfaces 206 of the above support beams 204. The carrier table 214a is arranged adjacent to one side (right side in FIG. 6) of the movable support member 210 and extends in the longitudinal direction along the movable support member 210. The other carrier table 214b is arranged adjacent to the other side (left side in FIG. 6) of the movable support member 210 and extends in the longitudinal direction along the movable support member 210.

The carrier tables 214a and 214b which may be made of a suitable material such as nylon which does not contaminate the silicon lump have receiving portions 220a and 220b in the center area, and V-shaped receiving grooves 222a and 222b extending in the longitudinal direction are formed in the top surfaces of the receiving portions 220a and 220b, respectively. Cover walls for covering the receiving portions 220a and 220b are further formed on the carrier tables 214a and 214b with a small space from the receiving portions 220a and 220b, respectively. The cover walls consist of vertical four walls, that is, both side walls 224a and 224b and front and rear walls 226a and 226b (the both side walls 224a and 224b and the front walls 226b and 226b are shown in FIG. 5 but rear walls are not shown), respectively.

As understood by referring to FIG. 5, the front end and the rear end of the above movable support member 210 are provided with a hanging connection portion 228 (only a connection portion hanging from the front end is shown in FIG. 5). A female screw through hole is formed in the crosswise direction (horizontal direction in FIG. 6) in the connection portion 228 hanging from the front end of the movable support member 210. A guide through hole is formed in the crosswise direction in the connection portion hanging from the rear end of the movable support member 210. Meanwhile, a pair of bearing members 230 are supported by suitable support legs (not shown) with a space therebetween in the crosswise direction below the front end of the movable support member 210. A male screw member 232 is rotatably fitted in the pair of bearing members 230. This male screw member 232 is screwed into the above screw through hole formed in the connection portion 228. One of the pair of the bearing members 230 incorporates an electric motor (not shown) which is connected to the male screw member 232. A pair of support members 234 (only one of them is shown in FIG. 5) are also supported by suitable support legs (not shown) with a space therebetween in the crosswise direction below the rear end of the movable support member 210, and a guide rod 236 is fixed between the pair of support members 234. This guide rod 236 is inserted into the guide hole formed in the connection portion. When the electric motor is rotated normally, the carrier tables 214a and 214b mounted to the movable support member 210 through the auxiliary support members 212 are moved to one side (right direction in FIG. 6) in the crosswise direction together with the movable support member 210 and when the electric motor is rotated reversely, the carrier tables 214a and 214b mounted to the movable support member 210 through the auxiliary support members 212 are moved to the other side (left direction in FIG. 6) in the crosswise direction together with the movable support member 210.

Guide chutes 238a and 238b are provided on both sides of the above pair of support beams 204. The guide chutes 238a and 238b are situated outside in the crosswise direction of the pair of support beams 204 and below the pair of support beams 204. Roller conveyors 240a and 240b extending in the longitudinal direction are arranged below the guide chutes 238a and 238b, respectively. The roller conveyors 240a and 240b carry boxes container 242 whose top is open. Receiving openings corresponding to the sizes of the above carrier tables 214a and 124b are formed in the top surfaces of the guide chutes 238a and 238b, and exhaust openings corresponding to the size of each of the containers 242 are formed in the under surfaces of the guide chutes 238a and 238b, respectively.

A top panel 244 is installed above the center areas in the crosswise direction of the above pair of support beams 204 in such a manner that it can move vertically. The top panel 244 is provided with suitable lift means (not shown) and selectively moved to a work position (down position) shown by a solid line in FIG. 5 and FIG. 6 and to a non-work position (up position) shown by a two-dotted chain line in FIG. 6. A plurality of, for example, six support members 246 in the illustrated embodiment are fixed to the under surface of the top panel 244 at intervals in the longitudinal direction, and each of the support members 246 is provided with a set 248 of crushers. Like the first embodiment shown in FIGS. 1 to 4, each set 248 of crushers has three crushers 250a, 250b and 250c (first crusher 250a, second crusher 250b and third crusher 250c) (therefore, 18 crushers are provided in total in the second embodiment shown in FIG. 5 and FIG. 6). The three crushers 250a, 250b and 250c may be identical to the three crushers 12a, 12b and 12c (or 16a, 16b and 16c) in the first embodiment shown in FIGS. 1 to 4. The top panel 244 is further provided with a cover wall for covering the crushers 250a, 250b and 250c. This cover wall consists of hanging both side walls 252 and both end walls 254. As clearly understood by referring to FIG. 6, a rectangular sectional form defined by the lower end portions of the both side walls 252 and the both end walls 254 (FIG. 5) constituting the cover wall is made slightly smaller than rectangular sectional forms defined by the both side walls 224a and 224b and the both end walls 226a and 226b constituting the cover walls of the above carrier tables 214a and 214b. When the top panel 244 is moved down to the work position shown by the solid line, the lower end portions of the both side walls 252 and the both end walls 254 constituting the cover wall go into the inner sides of the both side walls 224a (or 224b) and the both end walls 226a (or 266b) constituting the cover wall to define a space closed by the both cover walls.

The function of the above-described silicon lump crushing apparatus will be summarized hereinunder with reference mainly to FIG. 6. When the movable support member 210 is located at the position shown by the solid line in FIG. 5 and FIG. 6, that is, the first work position, the carrier table 214a is positioned below the crushers 250a, 250b and 250c and the other carrier table 214b is displaced to one side (left side in FIG. 6) from the crushers 250a, 250b and 250c. A rod-like silicon lump 256 to be crushed has been brought into the receiving groove 222a of the carrier table 214a in the previous carry-in step. The length of the rod-like silicon lump may correspond to the region where the 18 crushers 250a, 250b and 250c mounted to the top panel 244 are existent. The top panel 244 and the crushers 250a, 250b and 250c mounted to the top panel 244 are located at the work position shown by the solid line in FIG. 6. In this state, for example, all of the 18 crushers 250a, 250b and 250c are put into operation, and the hammer heads (refer to FIG. 4) of the crushers 250a, 250b and 250c are collided with the silicon lump 256 stored in the carrier table 214a to crush the silicon lump 256. Since the above cover wall provided on the top panel 244 and the above cover wall provided on the carrier table 214a define a closed space cooperatively at this point, silicon pieces produced by the crushing of the silicon lump 256 are not scattered therearound. Meanwhile, a rod-like silicon lump 256 to be crushed is brought into the receiving groove 222b of the carrier table 214b displaced from the crushers 250a, 250b and 250c by a suitable carry-in mechanism (not shown).

Thereafter, the top panel 244 and the crushers 250a, 250b and 250c mounted to the top panel 244 are moved up to the non-work position shown by the two-dotted chain line in FIG. 6. Then, the movable support member 210 is moved (over a second work position 210-A which will be described hereinafter) to a second exhaust position on the other side shown by a two-dotted chain line 210-B in FIG. 6, that is, right side in FIG. 6. Then, the carrier table 214a is moved over the top surfaces of the pair of support beams 204 and turned in the clockwise direction in FIG. 6 at an angle of 90° or more, for example, about 110° as shown by a two-dotted chain line in FIG. 6, whereby the silicon lump crushed on the carrier table 214a is discharged downward and stored in the container 242 through the guide chute 238a. The container 242 storing the crushed silicon lump is carried to a predetermined position by the roller conveyor 240a, and a next empty container 242 is carried to a position below the guide chute 238a.

Thereafter, the movable support member 210 is moved to one side, that is, left side in FIG. 6 and located at a second work position shown by a two-dotted chain line 210-A. Then, the carrier table 214a is displaced to the other side (right side in FIG. 6) from the crushers 250a, 250b and 250c, and the other carrier table 214b is situated below the crushers 250a, 250b and 250c. Then, the top panel 244 and the crushers 250a, 250b and 250c mounted to the top panel 244 are moved down to the work position shown by the solid line in FIG. 6. Thereafter, for example, all of the 18 crushers 250a, 250b and 250c are put into operation, and the hammer heads (refer to FIG. 4) of the crushers 250a, 250b and 250c are collided with the silicon lump 256 stored in the carrier table 214b to crush the silicon lump 256. During this operation, a rod-like silicon lump 256 to be crushed is brought into the receiving groove 222a of the carrier table 214a by the suitable carry-in mechanism (not shown).

Thereafter, the top panel 244 and the crushers 250a, 250b and 250c mounted to the top panel 244 are moved up to the non-work position shown by the two-dotted chain line in FIG. 6. Then, the movable support member 210 is moved over the above first work position to a first exhaust position on one side shown by a two-dotted chain line 210-C in FIG. 6, that is, left side in FIG. 6. Then, the carrier table 214b is moved over the top surfaces of the pair of support beams 204 and turned in the counterclockwise direction in FIG. 6 at an angle of 90° or more, for example, about 110° as shown by a two-dotted chain line in FIG. 6, whereby the crushed silicon lump on the carrier table 214b is discharged downward and stored in a container 242 through the guide chute 238b. The container 242 storing the crushed silicon lump is carried to a predetermined position by the roller conveyor 240b, and a next empty container 242 is carried to a position below the guide chute 238b.

Thereafter, the movable support member 210 is moved to the other side, that is, right side in FIG. 6 and situated at the first work position shown by the solid line. Then, the carrier table 214a is positioned below the crushers 250a, 250b and 250c, and the other carrier table 214b is displaced to one side (left side in FIG. 6) from the crushers 250a, 250b and 250c. Then, the top panel 244 and the crushers 250a, 250b and 250c mounted to the top panel 244 are moved down to the work position shown by the solid line in FIG. 6. Thereafter, the above-described operation is repeated.

Experimental Example 1

A silicon lump was crushed by using the silicon lump crushing apparatus shown in FIGS. 1 to 4. The silicon lump was a approximately rod-like polycrystalline silicon lump and had an average diameter of 120 mm and a length of 800 mm. The distance between the outer surface of the silicon lump brought onto the support base and the end of the cover member for the six crushing means while the silicon lump was placed on the receiving groove of the carrier table was about 20 mm. The pitch P between a first set of crushers and a second set of crushers was 80 mm. In each of the first and second sets of crushers, the first crusher was arranged vertically and the second and third crushers were arranged on both sides of the first crusher at an angle of 60° from the first crusher and inclined at 60° inward and downward. The distance between the outer surface of the silicon lump brought onto the support base and the ends of the hammer heads of the six crushers while the silicon lump was placed on the receiving groove of the carrier table was 50 mm. The hammer heads of the crushers were made of a super hard alloy comprising tungsten carbide and cobalt as the main ingredients and had a diameter of 30 mm and a length of 50 mm.

0.9 MPa compressed air was supplied and all of the 6 crushers were put into operation to crush the silicon lump. The support frame was moved 90 mm each time in the longitudinal direction of the support base to crush the silicon lump 8 times, and the obtained silicon pieces were divided into a group of pieces having a maximum size D of 120 mm or more, a group of pieces having a maximum diameter D of less than 120 mm and 10 mm or more and a group of pieces having a maximum diameter D of less than 10 mm. Table 1 shows the yields (weights) of these groups.

Experimental Example 2

The same experiment as in Experimental Example was conducted except that only the second and third crushers of the first set and second set were put into operation without operating the first crushers at the center. The yields are shown in Table 1 below.

Experimental Example 3

The same experiment as in Experimental Example was conducted except that only the first crushers at the center of the first set and the second set were put into operation without operating the second and third crushers. The yields are shown in Table 1 below.

TABLE 1

| | Yield of silicon pieces | | |
|---|---|---|---|
| | D ≧ 120 mm | 120 mm > D ≧ 10 mm | 10 mm > D |
| Experimental Example 1 | 12 | 85 | 3 |
| Experimental Example 2 | 24 | 74 | 2 |
| Experimental Example 3 | 46 | 53 | 1 |

DESCRIPTION OF REFERENCE NUMERALS

| | |
|---|---|
| 2: | support base |
| 4: | support frame |
| 10: | first set of crushers |
| 12a: | crusher (first crusher) |
| 12b: | crusher (second crusher) |
| 12c: | crusher (third crusher) |
| 14: | second set of crushers |
| 16a: | crusher (first crusher) |
| 16b: | crusher (second crusher) |
| 16c: | crusher (third crusher) |
| 24: | cylinder case |
| 44: | blocking member |
| 46: | cylinder bore |
| 58: | piston |
| 66: | rod member |
| 74: | hammer head |
| 76: | elastic urging means |
| 82: | compressed air source |
| 84: | control valve means |
| 100: | movable carrier table |
| 102: | receiving groove |
| 104: | silicon lump |
| 202: | support base |
| 210: | movable support member |
| 214a: | carrier table |
| 214b: | carrier table |
| 222a: | receiving groove |
| 222b: | receiving groove |
| 248: | a set of crushers |
| 250a: | crusher (first crusher) |
| 250b: | crusher (second crusher |
| 250c: | crusher (third crusher) |
| 256: | silicon lump |

The invention claimed is:

1. A crusher for crushing a silicon lump, comprising:
a cylinder case for defining the space of a cylinder bore;
a piston which is stored in the cylinder bore in such a manner that it slidably move between a first position which is one end of the cylinder bore and a second position which is the other end of the cylinder bore;
a blocking member which is fixed in the cylinder case to define the other end of the cylinder bore;
a release path for making the other end of the cylinder bore open to the air;
elastic urging means for elastically urging the piston to the first position;
a rod member which extends from the piston toward the other end of the cylinder bore and projects from the cylinder bore through the blocking member;
a hammer head which is fixed onto the projecting end portion of the rod member;

a compressed air source;

communication means interposed between the one end of the cylinder bore and the compressed air source; and control valve means which is provided on the communication means and selectively switches the cylinder bore between an operation mode in which the cylinder bore is communicated with the compressed air source and a non-operation mode in which the one end of the cylinder bore is made open to the air, wherein when the control valve means is switched to the non-operation mode, the piston is elastically urged to the first position by the elastic urging action of the elastic urging means and when the control valve means is switched to the operation mode, the piston is driven to the second position by compressed air supplied to the one end of the cylinder bore from the compressed air source in defiance of the elastic urging action of the elastic urging means.

2. The crusher according to claim 1, wherein the cylinder case is made of a metal and its outer wall is covered with a synthetic resin cover member.

3. The crusher according to claim 2, wherein the cover member extends beyond the front end of the cylinder case, and the hammer head is situated posterior to the front end of the cover member when the piston is elastically urged to the first position and projects beyond the front end of the cover member when the piston is driven to the second position.

4. The crusher according to claim 3, wherein the hammer head has a cylindrical outer surface, and the inner diameter of a portion where the hammer head moves of the cover member corresponds to the outer diameter of the hammer head so that the movement of the hammer head is guided by the cover member.

5. The crusher according to any one of claims 1 to 4, wherein the hammer head is made of a super hard alloy.

* * * * *